United States Patent [19]

Weaver et al.

[11] Patent Number: 5,411,763

[45] Date of Patent: May 2, 1995

[54] METHOD OF MAKING A MODIFIED CERAMIC-CERAMIC COMPOSITE

[75] Inventors: Billy L. Weaver, Eagan, Minn.; Jerry C. McLaughlin, Oak Ridge; David P. Stinton, Knoxville, both of Tenn.

[73] Assignees: Martin Marietta Energy Systems, Inc., Oak Ridge, Tenn.; Minnesota Mining and Manufacturing Company, St. Paul, Minn.

[21] Appl. No.: 2,935

[22] Filed: Jan. 11, 1993

[51] Int. Cl.⁶ .............................................. C23C 16/00
[52] U.S. Cl. .................................. 427/249; 427/255.2; 427/376.2; 427/419.7
[58] Field of Search ................... 427/249, 255.2, 376.2, 427/419.7

[56] References Cited

U.S. PATENT DOCUMENTS

| | | | |
|---|---|---|---|
| 4,514,240 | 4/1985 | Heraud | 156/89 |
| 4,580,524 | 4/1986 | Lackey, Jr. et al. | 427/255.2 |
| 4,766,013 | 8/1988 | Warren | 427/228 |
| 4,980,202 | 12/1990 | Brennan et al. | 427/249 |

OTHER PUBLICATIONS

Stinton et al., "Advanced Ceramics by Chemical Vapor Deposition Techniques", Ceramic Bulletin, 1988 p. 350.
"Silicon Carbide Composite Components," Reagan et al., *Ceram. Eng. Sci. Proc.*, 9 [7-8] (1988), pp. 881-90.
3M Siconex TM Fiber-Reinforced Ceramic Data Sheet Aug. 1991.

*Primary Examiner*—Shrive Beck
*Assistant Examiner*—Benjamin L. Utech
*Attorney, Agent, or Firm*—Gary L. Griswold; Walter N. Kirn; Gregory D. Allen

[57] ABSTRACT

The present invention provides a method of making a shaped ceramic-ceramic composite articles, such as gas-fired radiant heat burner tubes, heat exchangers, flame dispersers, and other furnace elements, having a formed-on ceramic-ceramic composite thereon.

18 Claims, 3 Drawing Sheets

_5,411,763_

METHOD OF MAKING A MODIFIED CERAMIC-CERAMIC COMPOSITE

The U.S. Government has a paid-up license in this invention and the right in limited circumstances to require the patent owner to license others on reasonable terms as provided for by the terms of the contract CRADA No. ORNL 91-0061.

FIELD OF THE INVENTION

The present invention provides a method of making a modified, shaped ceramic-ceramic composite article. The modified, shaped composite is useful for gas-fired radiant heat burner tubes, heat exchangers, flame dispersers, and other furnace elements.

DESCRIPTION OF THE RELATED ART

Chemical vapor deposition (CVD) processes for making ceramic-ceramic composites wherein a ceramic matrix is deposited onto an array of ceramic fibers are known in the art. Such methods rely on the deposition of chemical products from a gaseous phase. Typically, such deposition occurs as gaseous reactants come into contact with a heated fibrous substrate.

An example of a commercially available ceramic-ceramic composite produced by conventional CVD methods is marketed under the trade designation "SICONEX FIBER REINFORCED CERAMIC COMPOSITE," by the 3M Company. Preparation of this ceramic composite, which comprises aluminoborosilicate ceramic fibers, a carbonaceous layer, and a silicon carbide layer, typically involves braiding, weaving, or filament winding aluminoborosilicate ceramic fibers in the shape of the composite (e.g., a tube), or alternatively, fashioning the aluminoborosilicate ceramic cloth into the desired shape. The shaped ceramic fiber is treated before or after shaping with phenolic resin which is cured to provide a rigidified article. The rigidified article is heated in an evacuated chamber such that the cured phenolic resin is carbonized. The article is then coated with silicon carbide via chemical vapor deposition at temperatures ranging from about 900° C. to about 1200° C. to provide a semi-permeable, chemically resistant coating of silicon carbide. The resultant rigid ceramic composite is useful at high temperatures in corrosive environments.

A chemical vapor deposition (CVD) process for preparing ceramic-ceramic composites is disclosed in U.S. Pat. No. 4,580,524 (Lackey, Jr. et al.).

SUMMARY OF THE INVENTION

The present invention provides a method for making a modified, shaped ceramic-ceramic composite, the method comprising the steps of:
 (a) providing a chemical vapor deposition (CVD) chamber assembly holding a fibrous form comprising first ceramic and/or carbon fiber(s) adjacent to at least a portion of a surface of a shaped ceramic-ceramic composite article, the shaped ceramic-ceramic composite article comprising second ceramic and/or carbon fiber(s) having a surface which is available for coating and a first coating comprising silicon carbide, silicon nitride, or a combination thereof at least partially covering the surface which is available for coating, the fibrous form having first and second (preferably opposite) sides, and the assembly including means for providing a thermal gradient between the first and second sides of the fibrous form; and
 (b) providing a thermal gradient between the first and second sides of the fibrous form such that there is a hot region and a cold region, infiltrating and depositing via chemical vapor deposition silicon carbide, silicon nitride, or a combination thereof onto at least a portion of the surface of the first ceramic fiber(s) and depositing the same onto at least a portion of the surface of the shaped ceramic-ceramic composite article, wherein the infiltration of silicon carbide, silicon nitride, or combination thereof proceeds from the hot region to the cold region of the fibrous form.

Preferably, the shaped ceramic-ceramic composite article further comprises a layer comprising carbonaceous material interposed between the surface of the second fiber(s) available for coating and the first coating of silicon carbide and/or silicon nitride. In another aspect, the method preferably further comprises the step of providing a layer comprising carbonaceous material onto at least a portion of the surface of the first fiber(s) prior to the deposition of the second coating comprising silicon carbide and/or silicon nitride. In yet another aspect, the modified, shaped ceramic-ceramic composite article provided by the method is preferably dense.

Typically, the modified, shaped ceramic-ceramic composite article made according to the method of the present invention comprises
 (i) a shaped ceramic-ceramic composite article comprising first ceramic and/or carbon fiber(s) having a surface which is available for coating and a first coating comprising silicon carbide, silicon nitride, or a combination thereof at least partially covering the surface which is available for coating; and
 (ii) formed onto at least a portion of the surface of the shaped ceramic-ceramic composite article a ceramic composite comprising a matrix of ceramic and/or carbon fiber(s) having a surface which is available for coating and a second coating comprising silicon carbide, silicon nitride, or a combination thereof coated onto the surface of the second fiber(s).

Optionally, the fibrous form can further comprise high temperature (i.e., about 1200° C. or more) glass, crystalline ceramic, or glass-ceramic microspheres.

In this application:

"fiber(s)" as used herein means fiber or fibers;

"carbonaceous" means a carbon matrix or coating wherein substantially all of the carbon is amorphous;

"carbon depositing" means the decomposition of a carbon-containing compound (e.g., propylene) to provide a carbonaceous material on a surface;

"chopped fibers" refers to continuous ceramic fibers that have been cut into lengths of about 0.1 cm or more (preferably, in the range from about 0.3 to about 0.5 cm); and "dense" means a ceramic matrix which is at least 75% of theoretical density (preferably at least 95% of theoretical density).

Modified, shaped ceramic-ceramic composite articles prepared according to the method of the present invention are useful as gas-fired radiant heat burner tubes, heat exchangers, flame dispersers, and other furnace elements (e.g., furnace articles which need to be attached or bolted to a furnace wall).

DETAILED DESCRIPTION OF PREFERRED EMBODIMENTS

Figure 1:
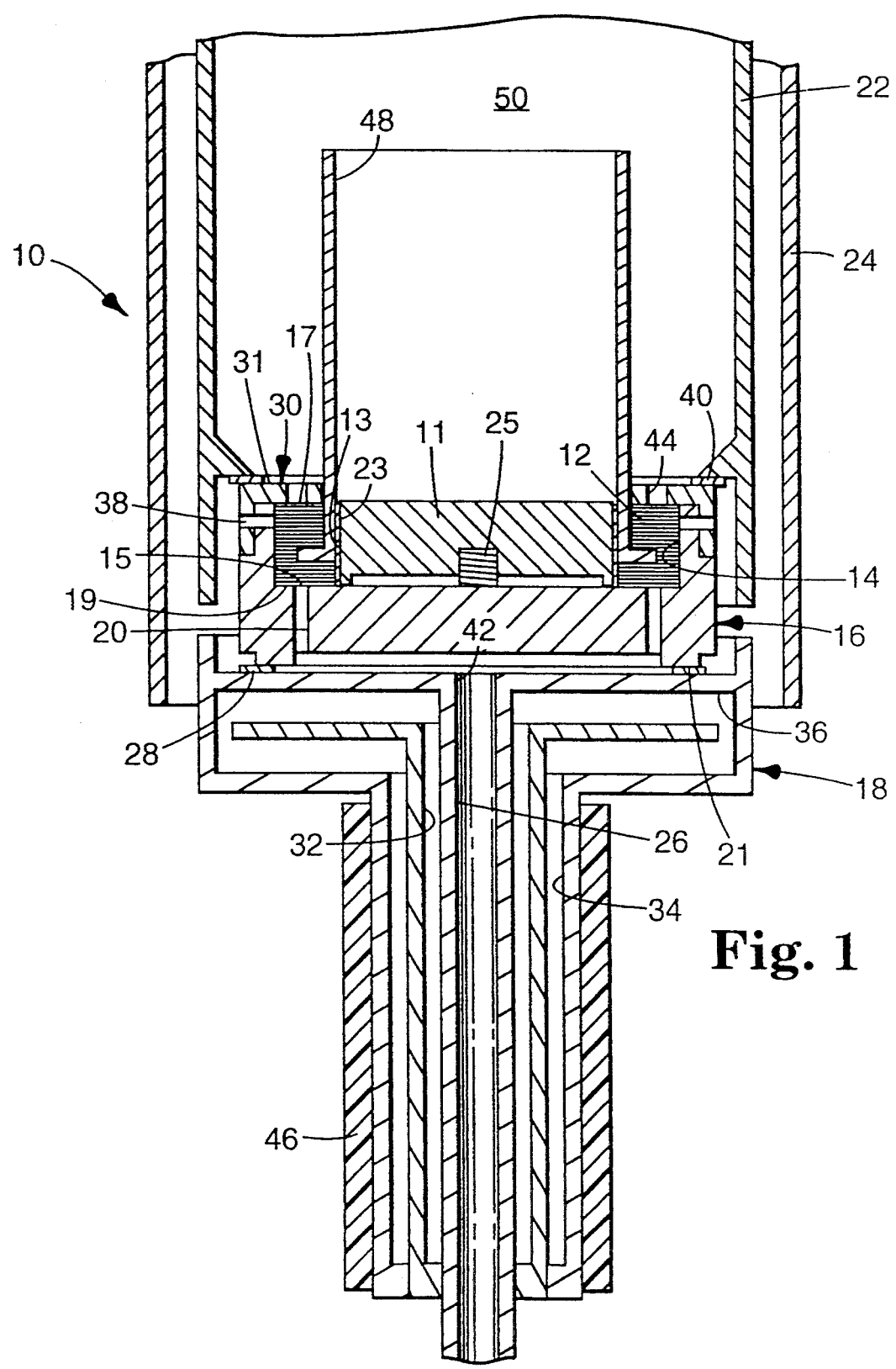
FIG. 1 is a cross-section of a chemical vapor infiltration furnace loaded with an article to be formed, wherein the furnace is arranged for deposition of silicon carbide, silicon nitride, or a combination thereof.

The first and second ceramic and/or carbon fibers can be the same or different. Preferably, the first and second ceramic fibers are independently alumina fibers, aluminosilicate fibers, aluminoborosilicate fibers, silicon carbide fibers, silicon nitride fibers, or combinations thereof. The most preferred fibers are aluminoborosilicate fibers. Preferably, the first and second fibers are the same, because the use of the same fibers tends to minimize thermal expansion mismatch problems.

Preferably, the ceramic and/or carbon fibers have a diameter in the range from about 5 to about 100 micrometers. Fibers having diameters substantially greater than about 100 micrometers are typically not as strong as fibers in the preferred range and tend to be difficult to weave, braid, or otherwise form into a desired shape. More preferably, the fibers have a diameter in the range from about 5 to about 50 micrometers. Most preferably, the fibers have a diameter in the range from about 7 to about 15 micrometers.

In another aspect, the first and second fibers preferably have an average tensile strength of greater than about 700 MPa. More preferably, the average tensile strength of the fibers is greater than about 1200 MPa, even more preferably, greater than about 1800 MPa, and, most preferably, greater than about 2100 MPa.

Methods for making suitable alumina fibers are known in the art and include the method disclosed in U.S. Pat. No. 4,954,462 (Wood et al.), the disclosure of which is incorporated herein by reference. Preferred alumina fibers are commercially available under the trade designation "NEXTEL 610" from the 3M Company of St. Paul, Minn.

Suitable aluminosilicate fibers are described in U.S. Pat. No. 4,047,965 (Karst et al.), the disclosure of which is incorporated herein by reference. Preferably, the aluminosilicate fibers comprise aluminum oxide in the range from about 67 to about 77 percent by weight and silicon oxide in the range from about 33 to about 23 percent by weight, calculated on a theoretical oxide basis as $Al_2O_3$ and $SiO_2$, respectively, based on the total weight of the aluminosilicate fibers. Preferred aluminosilicate fibers are commercially available under the trade designation "NEXTEL 550" from the 3M Company.

Suitable aluminoborosilicate fibers are described in U.S. Pat. No. 3,795,524 (Sowman), the disclosure of which is incorporated herein by reference. Preferably, the aluminoborosilicate fibers comprise aluminum oxide in the range from about 55 to about 75 percent by weight, silicon oxide in the range from less than 45 to greater than zero (preferably, less than 44 to greater than zero) percent by weight, and boron oxide in the range from less than 25 to greater than zero (preferably, about 1 to about 5) percent by weight, calculated on a theoretical oxide basis as $Al_2O_3$, $SiO_2$, and $B_2O_3$, respectively, based on the total weight of the aluminoborosilicate fibers. Preferred aluminoborosilicate fibers are commercially available under the trade designations "NEXTEL 312," "NEXTEL 440," and "NEXTEL 480" from the 3M Company.

Silicon carbide fibers are commercially available, for example, under the trade designation of "NICALON" from Nippon Carbon of Japan or Dow Corning of Midland, Mich.

Silicon nitride fibers are available from Toren Energy International Corp. of New York, N.Y.

Ceramic oxide fibers are typically available grouped together in the form of yarn. Such ceramic oxide yarn typically comprise from about 780 to about 7800 individual ceramic oxide fibers and generally have a diameter in the range from about 0.2 to about 1.5 mm. Yarn diameters in these ranges typically have superior textile qualities as compared to yarns with diameters outside these ranges. Ceramic oxide yarn can be ply-twisted.

Based on packing considerations, the optional microspheres preferably have a diameter of less than about 100 micrometers. More preferably, the microspheres have a diameter of less than about 50 micrometers and, most preferably, in the range from about 10 to about 15 micrometers. Suitable crystalline microspheres can be prepared as described in U.S. Pat. No. 5,077,241 (Moh et al.), the disclosure of which is incorporated herein by reference for its teaching of how to make the microspheres. Glass-ceramic (e.g., aluminosilicate microspheres are commercially available, for example, under the trade designation "EXTENDOSPHERES" from The PQ Corp. of Valley Forge, Pa. Glass, crystalline ceramic, or glass-ceramic beads may be useful in addition to or in place of the microspheres.

The shaped ceramic-ceramic composite article onto which the ceramic-ceramic composite is formed can be prepared using conventional techniques known in the art. Typically such a ceramic-ceramic composite is formed by braiding, knitting, or weaving the yarn into the desired shape (e.g., a hollow tube); braiding or weaving the yarn into a cloth or fabric and forming the cloth into a desired shape (e.g., a hollow tube, a sheet (including a flat sheet, a convex sheet, or a corrugated sheet), or a solid rod); or winding the yarn or fiber around a mandrel (e.g., helically winding or cross-winding the yarn or fiber around a mandrel). The shaped yarn is then coated with, silicon carbide and/or silicon nitride via chemical vapor deposition, typically at a temperature in the range from about 900° to about 1200° C. to provide a semi-permeable, chemically resistant coating.

Preferably, the shaped yarn or fiber(s) is treated before or after shaping, but before deposition of the silicon carbide or silicon nitride, with phenolic resin which is cured to provide a rigidified article. The rigidified article is then heated in an evacuated chamber such that the cured phenolic resin is carbonized. Preferably, the carbonization temperature is in the range from about 400° to about 600° C. and, more preferably, in the range from about 450° to about 500° C. The silicon carbide and/or silicon nitride is then deposited over the carbonized material.

An alternative shaped ceramic-ceramic composite article comprising ceramic oxide fiber(s), a first coating comprising a carbonaceous matrix which includes boron nitride particles in contact therewith, and a second coating comprising silicon carbide is described in copending application having U.S. Ser. No. 07/747,647, the disclosure of which is incorporated herein by reference.

The first fiber(s) can be in the form of fabric (woven or nonwoven), chopped fibers, or both. Chopped ceramic fibers can be prepared, for example, by cutting ceramic fiber or yarn chopped using a conventional glass roving cutter (commercially available, for example, as "MODEL 90 GLASS ROVING CUTTER" from Finn & Fram, Inc., of Pacoima, Calif.) or with a scissors. Preferably, the chopped fibers have a length in the range from about 1 to about 5 mm and, most preferably, are about 3 mm in length.

The method of the present invention involves forming a ceramic-ceramic composite comprising first ceramic and/or carbon fiber(s) and a coating of silicon carbide and/or silicon nitride onto a shaped ceramic-ceramic composite article comprising second ceramic and/or carbon fiber(s) and a coating of silicon carbide and/or silicon nitride in a forced flow thermal gradient chemical vapor infiltration furnace.

Figure 2:
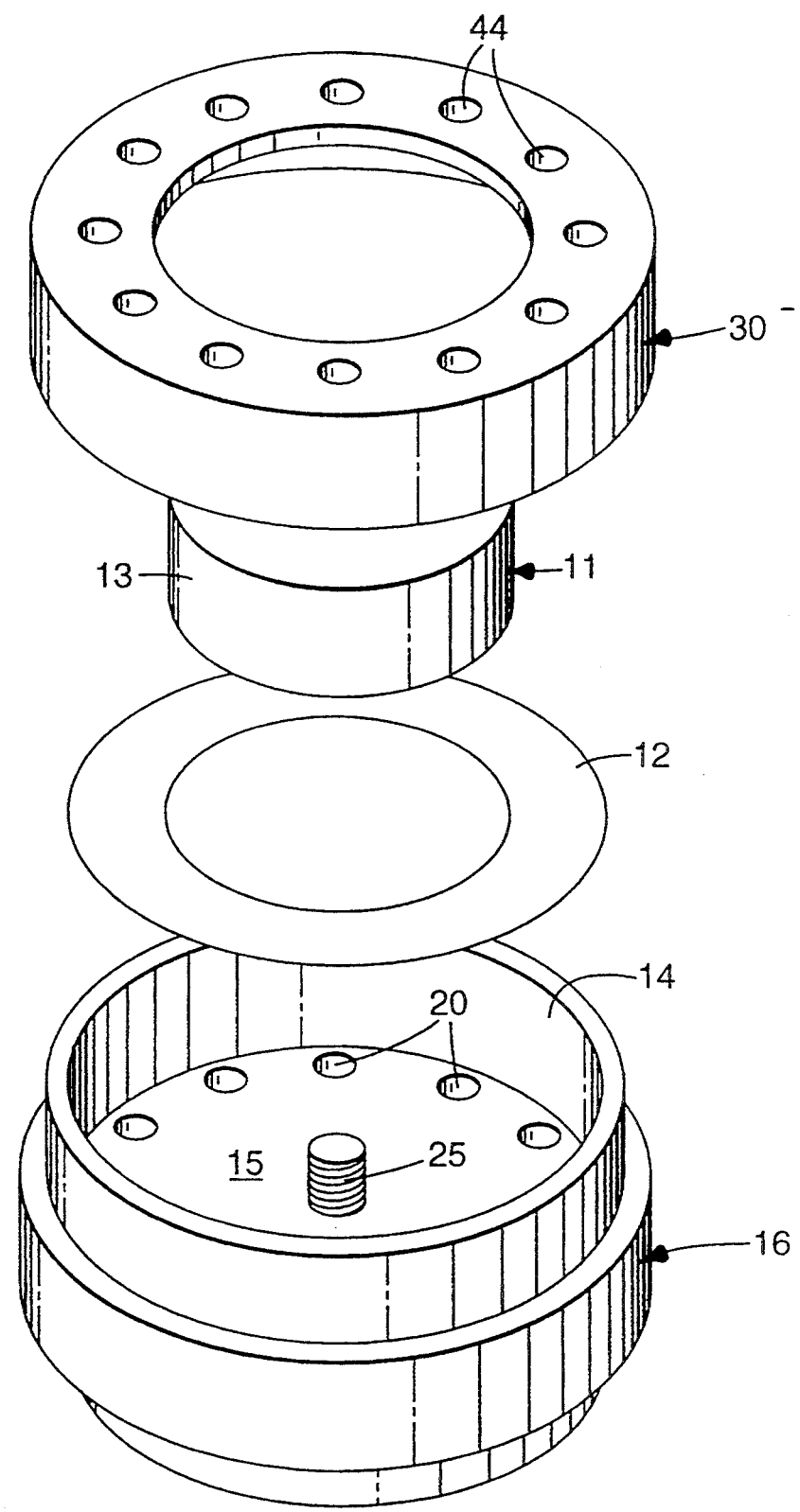
FIG. 2 is an exploded perspective view of a preferred mold assembly used in the method of the present invention.

FIGS. 1 and 2 illustrate a preferred furnace assembly 10 for practicing the method of the present invention. Chopped ceramic fibers and/or stacked ceramic fabric discs (i.e., fibrous form) 12 (ceramic fabric discs shown) are positioned in circular well 14 of graphite holder 16. Shaped ceramic-ceramic composite article 48 is pressed into and held against fibrous form 12 (having top 17 and bottom 19) in graphite holder 16 and extends upward from the top of graphite holder 16. Spacer 11 is threaded onto post 25. Graphite sheet 23 is placed between shaped ceramic-ceramic composite article 48 and surface 13 of holder 11.

Vented retaining ring 30 having holes 44 is held on graphite holder 16 by graphite retaining pins 38. Graphite foil 40 is used between vented retaining ring 30 and exhaust tube 22. Water is circulated in a jacketed lower section of holder 18 to cool surface 36. The water enters through tubes 32 and 34. Thermal insulation is provided by insulation (e.g., graphite) 46. Heat is supplied to top 17 of fibrous form 12 by means of cylindrical graphite heater 24 positioned outside and surrounding exhaust tube 22.

Reactant gases (e.g., methyltrichlorosilane (MTS) and hydrogen) are directed into fibrous form 12 via gas conduit tube 26 extending through circular holder 18 and communicating with graphite holder 16 via opening 42. Opening 42 communicates with fibrous form 12 7 through opening 20 in bottom 21 of graphite holder 16. Reactant gases flow through fibrous form 12 and, when sufficiently heated (i.e., to 1200° C. as measured by an optical pyrometer) near top 17 of fibrous form 12, the chemical vapor deposition reaction occurs. As a result, ceramic fibers of fibrous form 12 are coated and surrounded by the reaction product to form the matrix of the ceramic-ceramic composite. The higher the temperature, the more rapid the deposition. The infiltration by the reaction product occurs progressively from top 17 of fibrous form 12 toward bottom 19. Graphite sheets 28 are used to seal the jacketed lower section of circular holder 18 to graphite holder 16 and force the reactant gases to flow into fibrous form 12. Gases flow through fibrous form 12, and product deposits thereon as the hot surface is encountered. Gases exhaust out into chamber 50.

Although holder 18 is preferably machined from graphite, it can also be made of metal or ceramic. Graphite is preferred because of its high temperature use capability and its ease of machining. Suitable ceramic and metal materials include those that can be machined or otherwise formed into the desired shape and which can withstand the processing environment of the method of the present invention.

Preferably, ceramic fabric 12 is placed into holder 16 first, followed by chopped fiber 12. Shaped ceramic-ceramic composite tube 48 is then placed into holder 16. Additional chopped fiber 12 is placed around tube 48 in holder 16, followed by ceramic fabric 12.

Anisotropic graphite sheet material (commercially, for example, available under the trade designation "GRAFOIL" from Union Carbide Corp. of Cleveland, Ohio) is preferably used to line bottom 15 of holder 16. Further, anisotropic graphite sheet material is preferably placed around spacer 11. Such sheeting material aids in removing the finished part as well as minimizing the amount of gas which can escape through the walls of a graphite holder. Further, poor thermal conductivity of the graphite sheet aids in increasing the thermal gradient across the holder.

Optionally, the fibers contained in the holder (i.e., the first fibers) can then be treated with a carbon depositing gas, for example, a hydrocarbon (e.g., propylene, methane, or ethane), which decomposes at elevated temperatures to deposit a carbonaceous layer on the fibers in the holder. Though not essential in manufacture of the part, a carbonaceous layer generally is preferred because a carbon-containing interface layer is believed to improve the composite properties of the resulting ceramic-ceramic composite article.

Optionally, boron nitride can be deposited, for example, by chemical vapor deposition from boron trichloride and ammonia onto and/or within the coating comprising the carbonaceous material.

Figure 3:
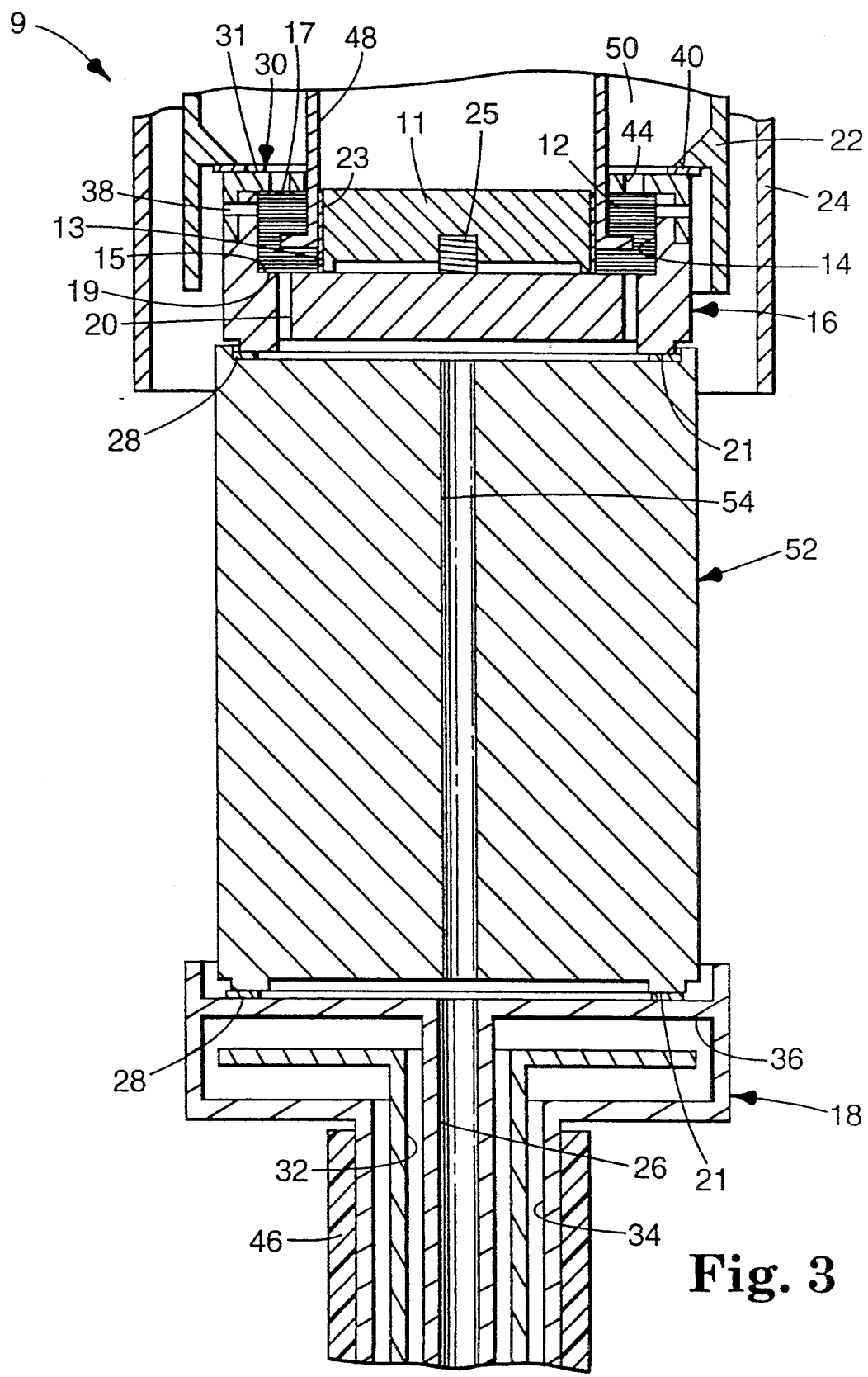
FIG. 3 is a cross-section of a furnace loaded with an article to be formed, wherein the furnace is arranged for deposition of carbonaceous material.

Because it is desired to have a relatively thin coating of carbon throughout the first fibers and the thermal gradient deposition method promotes formation of a relatively thick coating, the carbonaceous interface is preferably deposited in a reduced pressure, isothermal condition as opposed to a thermal gradient configuration. The furnace assembly shown in FIGS. 1 and 2 can be modified as shown in FIG. 3 for carbon deposition. Specifically, furnace assembly 9 is provided by placing spacer (preferably, a graphite spacer) 52 on top of holder 18. Holder 16 is then placed on top of spacer 52. Spacer 52 has hole 54 in its center to allow gases to come up from holder 52 to holder 16. Carbon deposition can be provided by heating the furnace to about 1100° C. and providing a carbon precursor gas flow (e.g., (a) propylene, methane, or propane and (b) argon or nitrogen) through holder 16. Carbonaceous material deposited on the fibers in this manner typically has a thickness of about 0.1 to 0.7 micrometer.

Alternatively, carbonaceous material may be deposited on the first fibers by treating them with phenolic resin, curing the resin, and then heating in an evacuated chamber such that the cured resin is carbonized. A typical carbonization temperature is in the range from about 400° to about 600° C., preferably, about 450° to about 500° C.

Deposition or infiltration of silicon carbide and/or silicon nitride can be provided using the general method described in U.S. Pat. No. 4,580,524 (Lackey et al.), the disclosure of which is incorporated herein by reference, modified as described herein. The fibrous form to be infiltrated is held within an apparatus, such as that depicted in FIGS. 1 and 2, which provides heat to one face of the form and provides water cooling to the opposite face and outer edges of the fibrous form. The flow of reactant gases is directed into the fibrous form at the cold face. The flow of reactant gases progresses through the fibrous form, and begins to react and deposit at the hot region. Due to the thermal gradient across the thickness of the fibrous form, deposition of the silicon carbide and/or silicon nitride occurs progressively from the hot region to the cold region and outer edges. Because of this progressive infiltration, the gases continue to flow into the fibrous form. Such infiltration occurs until all paths that the gas can follow through are filled. Unreacted gases flow past the shaped ceramic-ceramic composite article through vent holes in the top of the holder and/or, if the holder is porous (e.g., graphite holders tend to be porous), through the porous side walls of the holder and out the exhaust system.

Preferably, the hot region during infiltration and deposition of the silicon carbide, silicon nitride, or combination thereof is at a temperature in the range from about 1050° to about 1300° C. More preferably, the temperature of the hot region is in the range from about 1150° to about 1250° C. Preferably, the cold region during infiltration and deposition of the silicon carbide, silicon nitride, or combination thereof is at a temperature in the range from about 700° to about 800° C. (most preferably, about 750° C.) at the beginning of infiltration and deposition and in the range from about 900° to about 950° C. (most preferably, about 925° C.) at the end.

Suitable silicon carbide and silicon nitride precursors for the chemical vapor deposition are known in the art including methyltrichlorosilane (MTS) and hydrogen as a precursor for silicon carbide and ammonia, silicon tetrachloride, and hydrogen as a precursor for silicon nitride.

Preferably, the first and second fibers are each coated with the same silicon nitride and/or silicon nitride formulation, because the use of the same such coating tends to minimize thermal expansion mismatch problems.

After infiltration, the holder assembly is removed from the furnace and the holder is machined off the resulting ceramic-ceramic composite article. The resulting ceramic-ceramic composite article can be machined if further shaping is required.

The first fiber(s) comprises approximately 40 volume percent of the formed on ceramic-ceramic composite, although this can vary from about 20 to about 60 volume percent or more. The fiber(s) of the fibrous form should not be so densely packed that it is difficult to force gas through it. For the furnace assembly shown in FIGS. 1 and 2, the pressure required to force the reactant gases through the fibrous form at the beginning of the process is typically about 760 to about 800 Torr (preferably, about 760 to about 785 Torr). As the deposition proceeds, the pressure increases. The reaction is stopped (i.e., reactant gas flow turned off) when the pressure reaches about 1200 to about 1300 Torr.

The method of the present invention provides good bonding of the first fibers to the shaped ceramic-ceramic composite. That is, attempts to break the formed on ceramic-ceramic composite from the shaped ceramic-ceramic composite typically results in a break in the shaped ceramic-ceramic composite article rather than at the interface between the formed on ceramic-ceramic composite and the shaped ceramic-ceramic composite.

Objects and advantages of this invention are further illustrated by the following example, but the particular materials and amounts thereof recited in the example, as well as other conditions and details, should not be construed to unduly limit this invention. All parts and percentages are by weight unless otherwise indicated.

EXAMPLE 1

Example 1 illustrates the formation of a flange onto one end of a ceramic-ceramic composite tube using the method of the present invention.

A 5 cm (2 inch) diameter aluminoborosilicate fabric sleeving material (braided weave fabric; commercially available under the trade designation "NEXTEL 312 AF-14" from the 3M Company, St. Paul, Minn.) cut to a length of 10 cm (4 inches) was fitted onto a 5 cm (2 inch) mandrel. The fabric sleeving was trimmed so that the fabric edges were even on one end. A 0.32 cm (⅛ inch) flare was formed at the other end of the fabric sleeving by pulling the fabric out from the end of the mandrel to form a lip.

The fabric sleeving was saturated with a phenolic resin solution prepared by diluting a water-based phenolic resin (commercially available under the trade designation "BKUA-2370-UCAR" from Union Carbide of Danbury, Conn.) with methanol in a ratio of 1 part resin to 19 parts methanol. To provide uniform coverage of the resin solution, the fabric sleeving was rotated while resin solution was poured onto it. The resin-coated fabric sleeve was dried in air for about 30 minutes, followed by a 30 minute cure in a conventional oven at about 200° C. The cured resin-coated fabric sleeve was removed from the mandrel, and then suspended from a graphite plate having a 5.7 cm diameter hole in the center to suspend the tube. The suspended tube was then loaded into a conventional quartz chemical vapor deposition tube furnace. The furnace tube was about 20.3 cm (8 inch) in diameter and about 61 cm (2 feet) in length. Hydrogen gas was passed through the quartz tube while the furnace was RF heated to about 1100° C. to carbonize the cured resin. The heating schedule was as follows:

| Temperature | Heat up time, minutes |
| --- | --- |
| room temperature (about 25° C.) to 250° C. | 18 |
| 250° C. to 450° C. | 20 |
| 450° C. to 1100° C. | 45 |

At about 1100° C., the flow of hydrogen gas was replaced with a flow of hydrogen gas which had been bubbled through methyltrichlorosilane (MTS). Byproducts and unreacted gases exited at the end of the tube opposite that into which the precursor was introduced. The exit gas flowed through the vacuum pumping system and then through a scrubbing system. The pressure within the quartz tube during the reaction of the silicon carbide precursor was about 25 Torr. The flow rate of the precursor gas provided about 1.5 liter per minute of MTS and about 1.5 liter per minute of hydrogen gas.

The silicon carbide deposition time was about 10 hours. The average silicon carbide content of the ceramic-ceramic composite tube prepared in this manner was about 64 weight percent, based on the total weight of the tube.

In order to form a flange onto the end of the ceramic-ceramic composite tube, a furnace assembly as shown in FIGS. 1 and 2 was used. Holder 16 was machined from graphite (available from Great Lakes Carbon Corporation, Briarcliff Manor, N.Y.). A 0.08 cm (1/32 inch) thick sheet of anisotropic graphite (commercially available under the trade designation "GRAFOIL" from Union Carbide Corp., Cleveland, Ohio) was cut into a 7.6 cm (3 inch) diameter disk having a 0.95 cm (⅜ inch) diameter hole in the center. The graphite disk was adhered to the bottom of the cavity in graphite holder 16 using a thin film of a graphite adhesive (commercially available under the trade designation "GRAPHI-BOND, GRADE 551-R," from Aremco Products, Inc., of Ossining, N.Y.). The graphite adhesive was allowed to set for about 10 minutes. Holes 20, 0.48 cm (3/16 inch) in diameter, were then cut into the graphite sheet to match the holes in holder 16 as shown in FIGS. 1 and 2. Graphite spacer 11 was then threaded onto post 25 of holder 16 to provide a toroidal cavity that served as a mold for shaping the fibers onto the ceramic-ceramic composite tube. Graphite sheet 23 was applied to surface 13 of spacer 11 using graphite adhesive ("GRAPHI-BOND, GRADE 551-R").

Rings having an outside diameter of 7.6 cm (3 inches) and an inside diameter of 5.1 cm (2 inches) were cut from an aluminoborosilicate fabric (plain weave, "NEXTEL 312 AF14"). Twenty-five of these rings were stacked into the cavity and pressed down firmly into place. A thin layer of chopped aluminosilicate fibers ("NEXTEL 312") prepared by cutting yarn into 0.1–0.5 cm lengths with a scissors were placed into the cavity.

The ceramic-ceramic composite tube was placed into circular well 14 with the small flare at the end pressing into the layer of chopped fiber. A second layer of chopped fiber was placed on top of the flare. Thirty layers of aluminoborosilicate plain weave ("NEXTEL 312 AF14") rings were then placed in the cavity. Graphite retaining ring 30 having vent holes 44 was then placed on graphite holder 16 and pressed down to compress the fibers in circular well 14. A total of 40.8 grams of aluminoborosilicate material (i.e., chopped fiber and fabric rings) were placed in circular well 14. Each aluminoborosilicate ring was rotated about 30° in sequence with reference to the warp yarn.

Referring to FIG. 3, graphite spacer 52 was placed onto holder 18. The graphite holder assembly (i.e., graphite holder 16, composite tube 48, and fibrous form 12) was placed onto graphite spacer 52. The purpose of the graphite spacer 52 was to remove the thermal gradient from the graphite holder assembly, allowing deposition to occur isothermally. At a deposition temperature of 1100° C., pressure of 15 Torr, argon flow rate of 1400 cm$^3$/minute, and propylene ($C_3H_6$) flow rate of 40 cm$^3$/minute, carbonaceous material was deposited onto fibrous form 12 by decomposition of the propylene. The carbon deposition was carried out over 4.4 hours. A total of 5.9 grams of carbon was deposited onto the fibrous form, which, assuming uniform deposition, is equivalent to providing a 0.4 micrometer thick coating on each fiber.

The graphite holder assembly was removed from the furnace and graphite spacer 52 was removed. The graphite holder assembly was then placed on holder 18. Graphite holder 16 and holder 18 were placed into the furnace and bolted in place as shown in FIG. 1. Graphite exhaust tube 22 was used to press graphite holder 16 tightly onto holder 18.

After the graphite holder assembly was positioned, the temperature of the top surface 31 of graphite retaining ring 30 was raised from room temperature to about 1200° C. by resistive (graphite) heater 24. The exit temperature of the water from the water-cooled portion 36 of holder 18 was about 75° C. After the temperature stabilized at top surface 31 of retaining ring 30, the reactant gas flow was started. The flow rates were: methyltrichlorosilane (MTS) 64 cm$^3$/minute and hydrogen 630 cm$^3$/minute. Deposition was conducted at atmospheric pressure (i.e., the system was vented to the air). The pressure required to maintain this flow rate through the holder as deposition proceeded (i.e., through all the fibers in the graphite holder) was monitored. The densification was considered complete when the pressure required to force 64 c$^3$/min of MTS and 630 cm$^3$/min of $H_2$ exceeded 1270 Torr. This increase in back pressure indicated that very few pathways remained for the reactive gases to move between the fibers. Deposition was terminated by stopping the gas flow and turning the power supply to the heating elements off. The deposition time was 19 hours. About 70 grams of silicon carbide were deposited onto the fibers in the graphite holders.

The furnace was cool enough after about 4 hours to remove the graphite holder assembly from the furnace. The graphite holder was removed by machining it away from the resulting ceramic composite. The first ceramic fibers, now infiltrated with silicon carbide, were firmly bonded to the composite tube.

Various modifications and alterations of this invention will become apparent to those skilled in the art without departing from the scope and spirit of this invention, and it should be understood that this invention is not to be unduly limited to the illustrative embodiments set forth herein.

What is claimed is:

1. A method of making a modified, shaped ceramic-ceramic composite article, said method comprising the steps of:
   (a) providing first fiber selected from the group consisting of ceramic fiber, carbon fiber, and combinations thereof, said first fiber (i) being in a fibrous form, (ii) capable of being provided in a fibrous form, (iii) or a combination thereof;
   (b) providing a shaped ceramic-ceramic composite article comprising second fiber having a surface which is available for coating and a coating comprising silicon carbide, silicon nitride, or a combination thereof at least partially covering said surface which is available for coating, said second fiber being selected from the group consisting of ceramic fiber, carbon fiber, and combinations thereof;
   (c) providing a chemical vapor deposition chamber assembly capable of holding a fibrous form adjacent to at least a portion of a surface of said shaped ceramic-ceramic composite article, said assembly including means for providing a thermal gradient between first and second sides of said fibrous form;
   (d) assembling the components of (a), (b), and (c) to provide a chemical vapor deposition chamber assembly holding a fibrous form comprising said first fiber adjacent to at least a portion of a surface of said shaped ceramic-ceramic composite article, said fibrous form being arranged such that said first and second sides of said fibrous form are arranged in said assembly such that said means for providing a thermal gradient can provide a thermal gradient between said first and second sides of said fibrous form; and (e) providing a thermal gradient between said first and second sides of said fibrous form such that there is a hot region and a cold region, infiltrating and depositing via chemical vapor deposition silicon carbide, silicon nitride, or a combination thereof onto at least a portion of said surface of said first fiber and depositing said silicon carbide, silicon nitride, or a combination thereof onto at least a portion of said surface of said shaped ceramic-ceramic composite article, wherein said infiltration of silicon carbide, silicon nitride, or combination thereof proceeds from said hot region to said cold region of said fibrous form of said first fiber.

2. The method according to claim 1 wherein said shaped ceramic-ceramic composite article further comprises a layer comprising carbonaceous material interposed between said surface of said second fiber available for coating and said coating comprising silicon carbide, silicon nitride, or a combination thereof.

3. The method according to claim 1 further comprising the step of providing a layer comprising carbonaceous material onto at least a portion of said first fiber before depositing said silicon carbide, silicon nitride, or a combination thereof.

4. The method according to claim 1 wherein said shaped ceramic-ceramic composite article further comprises a layer comprising carbonaceous material interposed between said surface of said second fiber available for coating and said coating comprising silicon carbide, silicon nitride, or a combination thereof, and further comprising the step of providing a layer comprising carbonaceous material onto at least a portion of said first fiber before depositing said silicon carbide, silicon nitride, or a combination thereof.

5. The method according to claim 4 wherein said first fiber is ceramic fiber selected from the group consisting of alumina fiber, silicon carbide fiber, and combinations thereof, and said second fiber is ceramic fiber selected from the group consisting of alumina fiber, silicon carbide fiber, and combinations thereof.

6. The method according to claim 5 wherein said first and second fibers have the same composition.

7. The method according to claim 4 wherein said first and second fibers have the same composition.

8. The method according to claim 4 wherein said first fiber and said second fiber are both aluminosilicate ceramic fiber.

9. The method according to claim 8 wherein said first fiber comprises aluminum oxide in the range from about 67 to about 77 percent by weight and silicon oxide in the range from about 33 to about 23 percent by weight, calculated on a theoretical oxide basis as $Al_2O_3$ and $SiO_2$, respectively, based on the total weight of said said first fiber, and wherein said second fiber comprises aluminum oxide in the range from about 67 to about 77 percent by weight and silicon oxide in the range from about 33 to about 23 percent by weight, calculated on a theoretical oxide basis as $Al_2O_3$ and $SiO_2$, respectively, based on the total weight of said second fiber.

10. The method according to claim 4 wherein said first fiber and said second fiber are both aluminoborosilicate ceramic fiber.

11. The method according to claim 10 wherein said first fiber comprises aluminum oxide in the range from about 55 to about 75 percent by weight, silicon oxide in the range from less than 45 to greater than zero percent by weight, and boron oxide in the range from less than 25 to greater than zero percent by weight, calculated on a theoretical oxide basis as $Al_2O_3$, $SiO_2$, and $B_2O_3$, respectively, based on the total weight of said first fiber, and wherein said second fiber comprises aluminum oxide in the range from about 55 to about 75 percent by weight, silicon oxide in the range from less than 45 to greater than zero percent by weight, and boron oxide in the range from less than 25 to greater than zero percent by weight, calculated on a theoretical oxide basis as $Al_2O_3$, $SiO_2$, and $B_2O_3$, respectively, based on the total weight of said second fiber.

12. The method according to claim 4 wherein said first fiber includes chopped fibers.

13. The method according to claim 4 wherein the total deposition time of said coating comprising silicon carbide is less than about fifty hours.

14. The method according to claim 4 wherein the total deposition time of said coating comprising silicon carbide is less than about thirty hours.

15. The method according to claim 4 wherein the total deposition time of said coating comprising silicon carbide is less than about twenty hours.

16. The method according to claim 4 wherein said coating of silicon carbide, silicon nitride, or a combination thereof is distributed throughout said matrix of said second fiber.

17. The method according to claim 4 wherein said modified, shaped ceramic-ceramic composite article provided by said method is dense.

18. The method according to claim 4 wherein said shaped composite article is selected from the group consisting of a hollow tube, a solid rod, and a sheet.

* * * * *

UNITED STATES PATENT AND TRADEMARK OFFICE
CERTIFICATE OF CORRECTION

PATENT NO. : 5,411,763
DATED : May 2, 1995
INVENTOR(S) : Weaver et al

It is certified that error appears in the above-indentified patent and that said Letters Patent is hereby corrected as shown below:

Col. 5, line 49, "form 12 7" should read --form 12 --.
Col. 9, line 57, "Tort" should be --Torr --.

Signed and Sealed this

Twenty-fourth Day of October, 1995

Attest:

BRUCE LEHMAN

*Attesting Officer*  *Commissioner of Patents and Trademarks*